(12) United States Patent
Leibowitz

(10) Patent No.: US 11,962,266 B2
(45) Date of Patent: Apr. 16, 2024

(54) SOLAR WINDOW IMPROVEMENT

(71) Applicant: Lonnie Leibowitz, Shrub Oak, NY (US)

(72) Inventor: Lonnie Leibowitz, Shrub Oak, NY (US)

(*) Notice: Subject to any disclaimer, the term of this patent is extended or adjusted under 35 U.S.C. 154(b) by 0 days.

(21) Appl. No.: 18/468,340

(22) Filed: Sep. 15, 2023

(65) Prior Publication Data
US 2024/0097605 A1 Mar. 21, 2024

Related U.S. Application Data

(60) Provisional application No. 63/406,999, filed on Sep. 15, 2022.

(51) Int. Cl.
H02S 20/26 (2014.01)
E06B 7/28 (2006.01)
H10K 30/40 (2023.01)
H10K 30/85 (2023.01)
H10K 30/87 (2023.01)
E06B 9/24 (2006.01)

(52) U.S. Cl.
CPC ............ H02S 20/26 (2014.12); E06B 7/28 (2013.01); H10K 30/40 (2023.02); H10K 30/85 (2023.02); H10K 30/87 (2023.02); E06B 9/24 (2013.01); E06B 2009/2464 (2013.01); E06B 2009/2476 (2013.01)

(58) Field of Classification Search
CPC ......... H10K 30/40; H10K 30/85; H10K 30/87
See application file for complete search history.

(56) References Cited

FOREIGN PATENT DOCUMENTS

| CN | 104681657 A | * | 6/2015 | ....... H01L 31/02168 |
| GB | 2451108 A | * | 1/2009 | ............. B82Y 10/00 |

OTHER PUBLICATIONS

English machine translation of CN 104681657 A (Year: 2023).*

* cited by examiner

Primary Examiner — Angelo Trivisonno
(74) Attorney, Agent, or Firm — RC Trademark Company

(57) ABSTRACT

According to some embodiments, an electrical generating window comprises a first substrate layer, an anode layer disposed adjacent to the first substrate layer, a hole transport layer disposed adjacent to the anode layer, an active layer disposed adjacent to the hole transport layer, an electron transport layer disposed adjacent to the active layer, a cathode layer disposed adjacent to the electron transport layer, and a second substrate layer adjacent to the cathode layer. Two or more electron conveyance cylinders are disposed between the second substrate layer and the active layer.

4 Claims, 3 Drawing Sheets

SOLAR WINDOW IMPROVEMENT

BACKGROUND

Solar windows function as a conventional window while also generating electricity from the sun as they provide an energy source for your home or commercial building. However, given that a physical area of windows is limited on a structure, and that consumer use of electricity is increasing, it would be beneficial to improve the efficiency of solar windows to provide as much electricity as possible.

SUMMARY

Some embodiments described herein relate to an electrical generating window. The electrical generating window comprises an anode layer, a hole transport layer disposed adjacent to the anode layer, an active layer disposed adjacent to the hole transport layer, an electron transport layer disposed adjacent to the active layer, and a cathode layer disposed adjacent to the electron transport layer. Two or more electron conveyance cylinders are disposed between the second substrate layer and the active layer.

DETAILED DESCRIPTION

In the following detailed description, numerous specific details are set forth in order to provide a thorough understanding of the embodiments. However, it will be understood by those of ordinary skill in the art that the embodiments may be practiced without these specific details. In other instances, well-known methods, procedures, and components have not been described in detail so as not to obscure the embodiments. A conventional solar window 100 is comprised of a plurality of layers such as: the Cathode layer 110 which is a metal layer that conducts a negatively charged electron, an Electron Transport Layer 120 which attracts the electron of the exciton, an Active Layer 130 which is a solar-activated layer that generates an exciton (i.e. an electron and hole in a bound state), a Hole Transport Layer 140 which attracts and directs the hole to the anode layer, and an Anode layer 150 which is a conductive layer that transports the positively charged hole.

The embodiments described herein relate to an improvement to a conventional solar window 100 which increases the efficiency of the energy producing ability of the solar window by increasing its energy collecting and conversion abilities. Conventional solar windows tend to become less efficient with size so as the window size increases, the windows do not produce significantly more power. The embodiments described herein remedy this issue.

Figure 1:
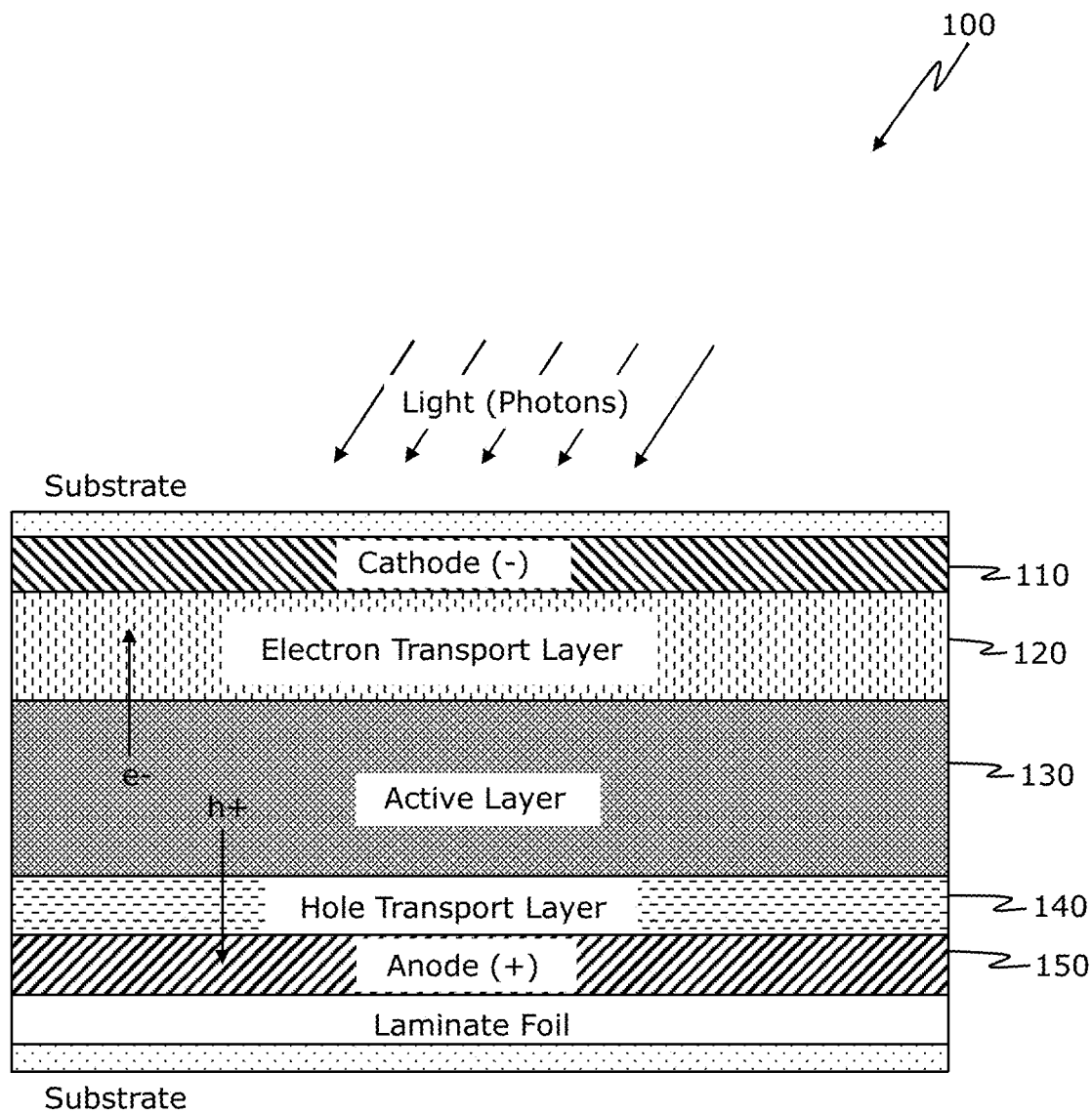
FIG. 1 illustrates layers of a solar window.
Figure 2:
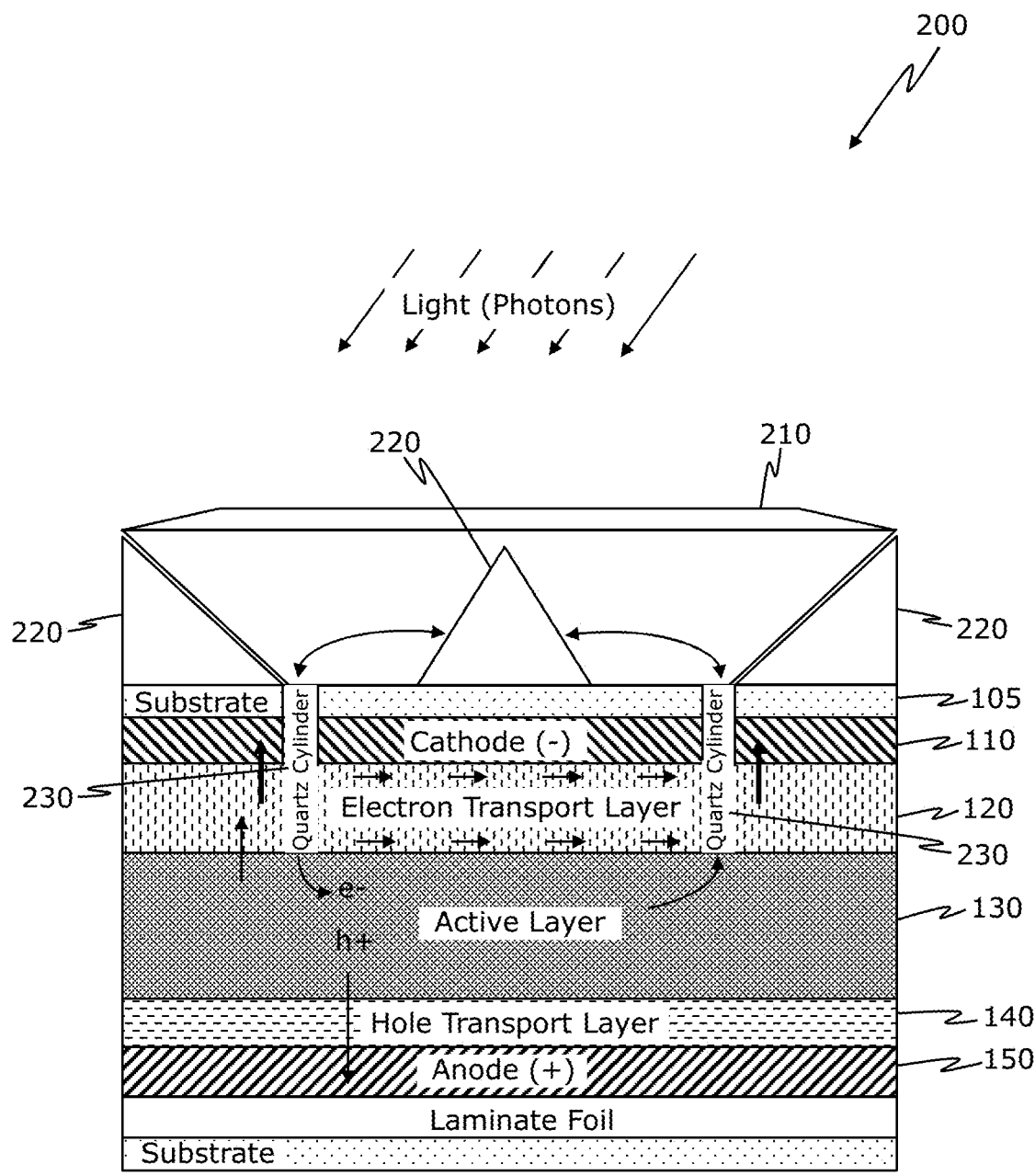
FIG. 2 illustrates layers of a solar window in accordance with some embodiments.
Figure 3:
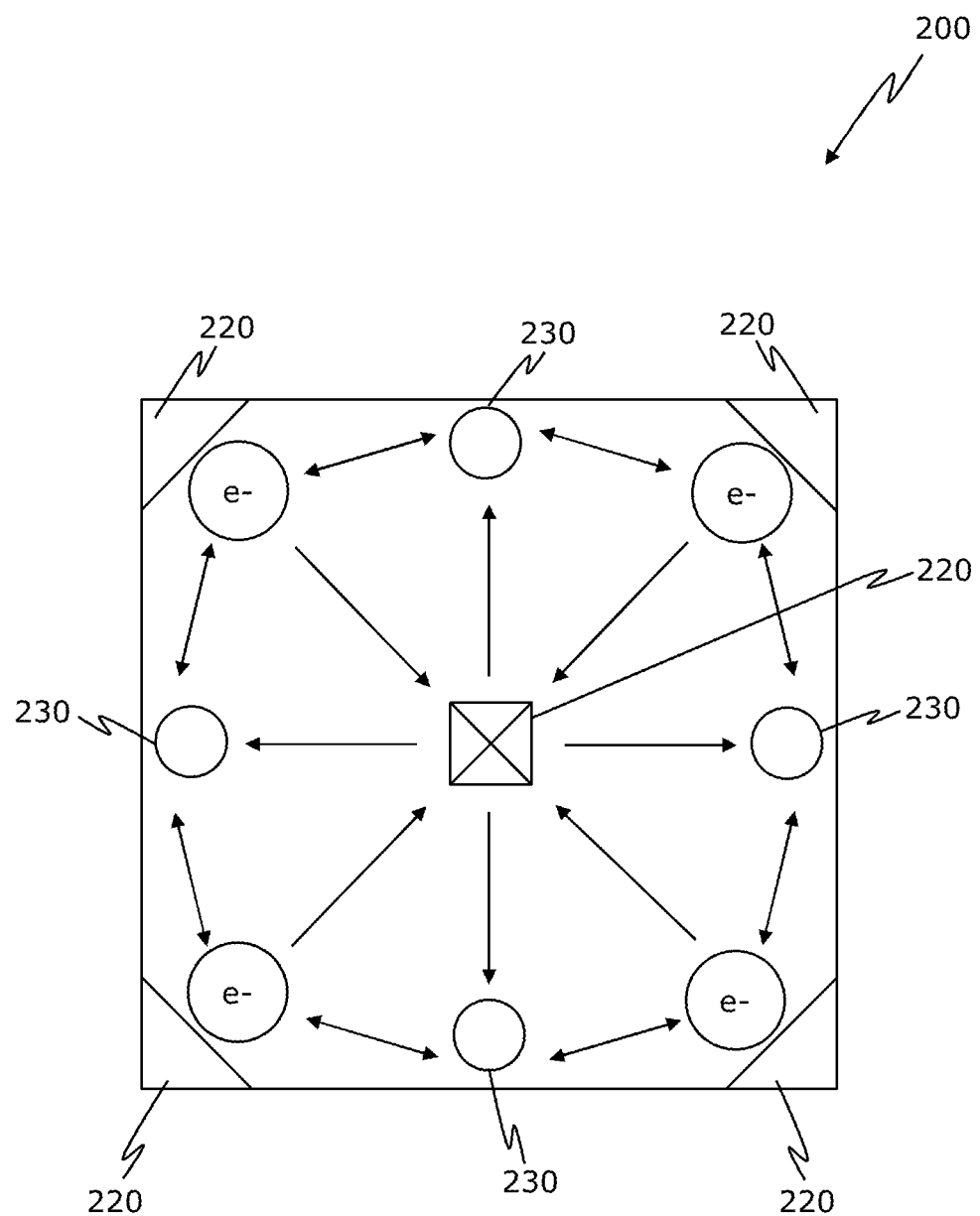
FIG. 3 illustrates a top view of a solar window in accordance with some embodiments.

Referring now to FIG. 2 and FIG. 3, an embodiment of a solar window 200 is illustrated. Solar window 200 is an improvement over existing solar window 100 technology and includes an electron motion chamber 210 which functions as an energy enhancement layer to increase energy production within the solar window 200. The electron motion chamber 210 may reside above a substrate 105 that is adjacent to the cathode 110 layer (a window may have both an upper and a lower substrate). The electron motion chamber 210 may be connected to the active layer 130 via a plurality of electron conveyance cylinders 230. In some embodiments, the electron conveyance cylinders 230 may be comprised of quartz and are thus quartz cylinders. In some embodiments, the electron conveyance cylinders 230 may be a quartz crystal comprising points on each end with a 55° slope.

The election motion chamber 210 may comprise a plurality of prismatic crystals 220 to excite, reflect and send elections in motion so that the electrons bounce around the election motion chamber 210 creating collisions and thus energy. In some embodiments, the electrons may move multi-directionally such as a back-and-forth movement or motion. In some embodiments, the plurality of prismatic crystals 220 may be comprised of calcite. In some embodiments, the prismatic crystals 220 may be positioned in corners of the window 200 and/or in a center of the window 200.

The electron conveyance cylinders 230 may move electrons between the electron motion chamber 210 and the active layer 130. By moving electrons from the active layer 130 to the electron motion chamber 210 in a loop, the electron motion chamber 210 acts as a gain of function for collecting and transferring energy. In some embodiments, the electron motion chamber 210 may be useful for other applications such as, but not limited to, color changing light for use in windows and even mirrors where the color is based on a light angle selection of prisms and creative use of transformers, capacitors (e.g., remote wireless controllers) and resistors regulating the frequencies (e.g., speed of electrons) flowing into the new glass/prismatic crystals via the electron conveyance cylinders 230. This flow between the electron motion chamber 210 through the electron conveyance cylinders 230 into the active layer and back to the electron motion chamber 210 creates a loop of excited electrons that "dance" around.

The electron motion chamber 210 may be considered as an upper glass substrate extension, or a glass window section that is disposed in front of the plurality of prismatic crystals 220 which, in some embodiments, are situated in all four corners of the glass window 200 and/or in a center or middle of the window 200.

In use, excited or energized electrons may bounce into, around, and off the prismatic crystals 220, gaining energy as they become excited by their interaction with the prismatic crystals 220. A center prismatic crystals may help bounce the electrons toward the corners thus providing more energy in larger windows.

Calcite has a much greater birefringence than quartz so a steady stream of electrons may gain significant energy from moving from the electron conveyance cylinders 230 which, in some embodiments is made from quartz, to the electron's interaction with the prismatic crystals 220 which in some embodiments are made from calcite.

In some embodiments, once electrons are released in the electron motion chamber 210 (e.g., the "main glass, substrate/window area") the electrons move rapidly because their energy is enhanced by the prismatic crystals 220. In other embodiments, a main prismatic crystal 220 (e.g., calcite crystal) may be positioned in a center of a window, as a prismatic pyramid structure, and four more "calcite crystal bumpers" 220 located equidistantly on the edges of the glass between the corners. The exited electrons then filter back into the electron layer via one of the electron conveyance cylinders 230. Glass may include any transparent medium. In some embodiments, an angle of the prismatic pyramid structure sides may be 55 degrees.

When considering visual appeal, the prismatic crystals 220 need not be too large. Except for the center pyramid, the prismatic crystals 220 can generally stay out of sight for the window display. The center prismatic crystal 220 should not be unsightly either, as it is reflecting light from all sides but can also be covered by a window logo (e.g., etched glass).

This written description uses examples to disclose multiple embodiments, including the preferred embodiments, and also to enable any person skilled in the art to practice the invention, including making and using any devices or systems and performing any incorporated methods. Aspects from the various embodiments described, as well as other known equivalents for each such aspects, can be mixed and matched by one of ordinary skill in the art to construct additional embodiments and techniques in accordance with principles of this application.

Those in the art will appreciate that various adaptations and modifications of the above-described embodiments can be configured without departing from the scope and spirit of the claims. Therefore, it is to be understood that the claims may be practiced other than as specifically described herein.

What is claimed:

1. An electrical generating window comprising:
a substrate layer;
an anode layer disposed adjacent to the substrate layer;
a hole transport layer disposed adjacent to the anode layer;
an active layer disposed adjacent to the hole transport layer;
an electron transport layer disposed adjacent to the active layer;
a cathode layer disposed adjacent to the electron transport layer;
two or more electron conveyance cylinders disposed between the substrate layer and the active layer, wherein the electrical generating window comprises four corners; and
a plurality of calcite prismatic crystals imbedded in a glass or other transparent medium configured for (i) receiving electrons from the two or more electron conveyance cylinders, and (ii) accelerating the electrons where the accelerated electrons move multi-directionally through the two or more electron conveyance cylinders, and wherein a respective crystal of the plurality of prismatic crystals are disposed at each of the four corners of the electrical generating window.

2. The electrical generating window of claim 1, wherein moving multi-directionally comprises a back-and-forth movement.

3. The electrical generating window, of claim 1, wherein the two or more electron conveyance cylinders are comprised of quartz.

4. The electrical generating window, of claim 1, further comprising a center prismatic crystal disposed at a center of the electrical generating window.

* * * * *